United States Patent [19]

Odawara et al.

[11] Patent Number: 5,280,242
[45] Date of Patent: Jan. 18, 1994

[54] APPARATUS FOR DETECTING A FINE MAGNETIC FIELD WITH CHARACTERISTIC TESTING FUNCTION OF A DC SQUID

[75] Inventors: Akikazu Odawara; Satoshi Nakayama; Sattoshi Sekiya, all of Tokyo, Japan

[73] Assignee: Seiko Instruments Inc., Japan

[21] Appl. No.: 840,344

[22] Filed: Feb. 24, 1992

[30] Foreign Application Priority Data

Feb. 25, 1991 [JP] Japan ................ 3-30457

[51] Int. Cl.$^5$ ............................... G01R 33/035
[52] U.S. Cl. ................... 324/248; 307/306; 505/846
[58] Field of Search .............. 324/248, 345; 307/306, 307/309; 505/844-846; 128/653.1

[56] References Cited

U.S. PATENT DOCUMENTS

| 4,004,217 | 1/1977 | Giffard ................. 324/248 |
| 4,389,612 | 6/1983 | Simmonds et al. ......... 324/248 |
| 4,663,590 | 5/1987 | Gershenson et al. ....... 324/248 |
| 5,045,788 | 9/1991 | Hayashi et al. .......... 324/248 |

FOREIGN PATENT DOCUMENTS

| 0269074 | 10/1989 | Japan ................. 324/248 |
| 0197887 | 8/1991  | Japan ................. 324/248 |

Primary Examiner—Gerard R. Strecker
Attorney, Agent, or Firm—Bruce I. Adams; Van C. Wilks

[57] ABSTRACT

An apparatus for detecting a fine magnetic field comprises a DC SQUID which detects and converts a magnetic field to an electrical signal. A flux locked looped circuit drives the DC SQUID. The flux locked loop circuit includes an amplifier for amplifying the electrical signal. A phase detector modulates the amplified electrical signal and an integration circuit outputs a voltage signal corresponding to the detected magnetic field. An oscillator coupled to the phase detector supplies a demodulation frequency signal. A modulator including a first voltage-to-current converter and a second voltage-to-current converter is coupled with the integration circuit and the oscillator for supplying a modulation signal to the DC SQUID. The modulator further includes an external input terminal and a feedback modulation change-over circuit for changing an internal feedback signal to an external test signal inputted to the external input terminal. A bias source having a third voltage-to-current converter is coupled to the DC SQUID and supplies a bias signal. The bias source also includes an external input terminal and a change-over circuit for changing an internal bias signal to an external test signal inputted to the second external input terminal. An external output terminal is connected to the amplifier for supplying a monitoring test output signal from the DC SQUID. The apparatus for detecting a fine magnetic field thus provides a self-testing function for the DC SQUID.

10 Claims, 4 Drawing Sheets

APPARATUS FOR DETECTING A FINE MAGNETIC FIELD WITH CHARACTERISTIC TESTING FUNCTION OF A DC SQUID

BACKGROUND OF THE INVENTION

The present invention relates to a highly sensitive magnetic field detecting device using a DC superconducting quantum interference device (i.e., DC SQUID) for use in medical or underground resource searching applications.

The highly sensitive magnetic field detecting device is used for detecting a micro magnetic field. FIG. 5 is a block diagram showing an example of a highly sensitive magnetic field detecting device of the prior art. This highly sensitive magnetic field detecting device comprises at least a DC SQUID 2, a bias circuit 1, a signal amplifier 3, a phase detector 4, a feedback amplifier and a modulator, including oscillator 6 and two V/I converters 7 and 8. These elements, except the DC SQUID, constitute a flux locked loop (F.L.L.) circuit. The bias circuit is composed of a voltage source and a voltage-current converter so as to feed an electric current to the DC SQUID. A modulated signal coming from the DC SQUID fed with a bias current is amplified by the amplifier 3 and detected by a phase detector 4.

The detected signal is inputted to the integrator 5, which has its output feedback signal converted into an electric currrent. This current is added to the modulated signal converted into the current and is inputted together to the DC SQUID to fix the total magnetic flux applied to the DC SQUID always at a constant value. As a result, the magnetic field can be detected by monitoring the feedback signal. The detection of a fine magnetic field utilizes the aforementioned method, but the current-to-voltage characteristics and flux-to-voltage characteristics of the DC SQUID are measured by using a SQUID measurement device, as shown in a block diagram in FIG. 6.

The measurements of the current-to-voltage characteristics of the DC SQUID using the SQUID measurement device are accomplished: by sweeping the DC voltage source by the oscillator; by measuring a voltage generated in the DC SQUID; and by displaying the current against the voltage in an oscilloscope. The measurements of the flux-to-voltage characteristics are accomplished: by feeding the DC SQUID with the feedback modulation current swept by the oscillator while feeding the DC SQUID with a bias current equal to a critical current; by measuring a voltage generated in the DC SQUID; and by displaying the magnetic flux against the voltage in an oscilloscope.

Since the highly sensitive magnetic field detecting device of the prior art cannot sweep the bias current and the feedback modulation current by itself, the SQUID measurement device has to be used for measuring the element characteristics of the DC SQUID. According to this method, if it is intended to observe the element characteristics of the DC SQUID when the DC SQUID is driven as the highly sensitive magnetic field detecting device, the DC SQUID has to be disconnected from the F.L.L circuit device and connected with the SQUID element measurement device.

SUMMARY OF THE INVENTION

It is an object of the present invention to provide a magnetic field detecting device with a self testing function for a DC SQUID.

In order to achieve the object, the highly sensitive magnetic field detecting device has its feedback modulation circuit equipped partially with a feedback modulation change-over circuit and its bias circuit equipped partially with a bias change-over circuit. Thus, a feedback modulation signal and a bias power source can be inputted from the outside so that the current-to-voltage characteristics can be measured by inputting a bias current from the outside to measure the voltage of the DC SQUID without using the SQUID element measurement device. And, the flux-to-voltage characteristics can be measured by inputting the feedback modulation signal to measure the voltage of the DC SQUID with the bias current being constant.

According to the structure described above, the element characteristics of the DC SQUID can be easily observed even while the DC SQUID is being driven as the highly sensitive magnetic field detecting device.

BRIEF OF THE DRAWINGS

DETAILED DESCRIPTION OF THE PREFERRED EMBODIMENT

Figure 1:
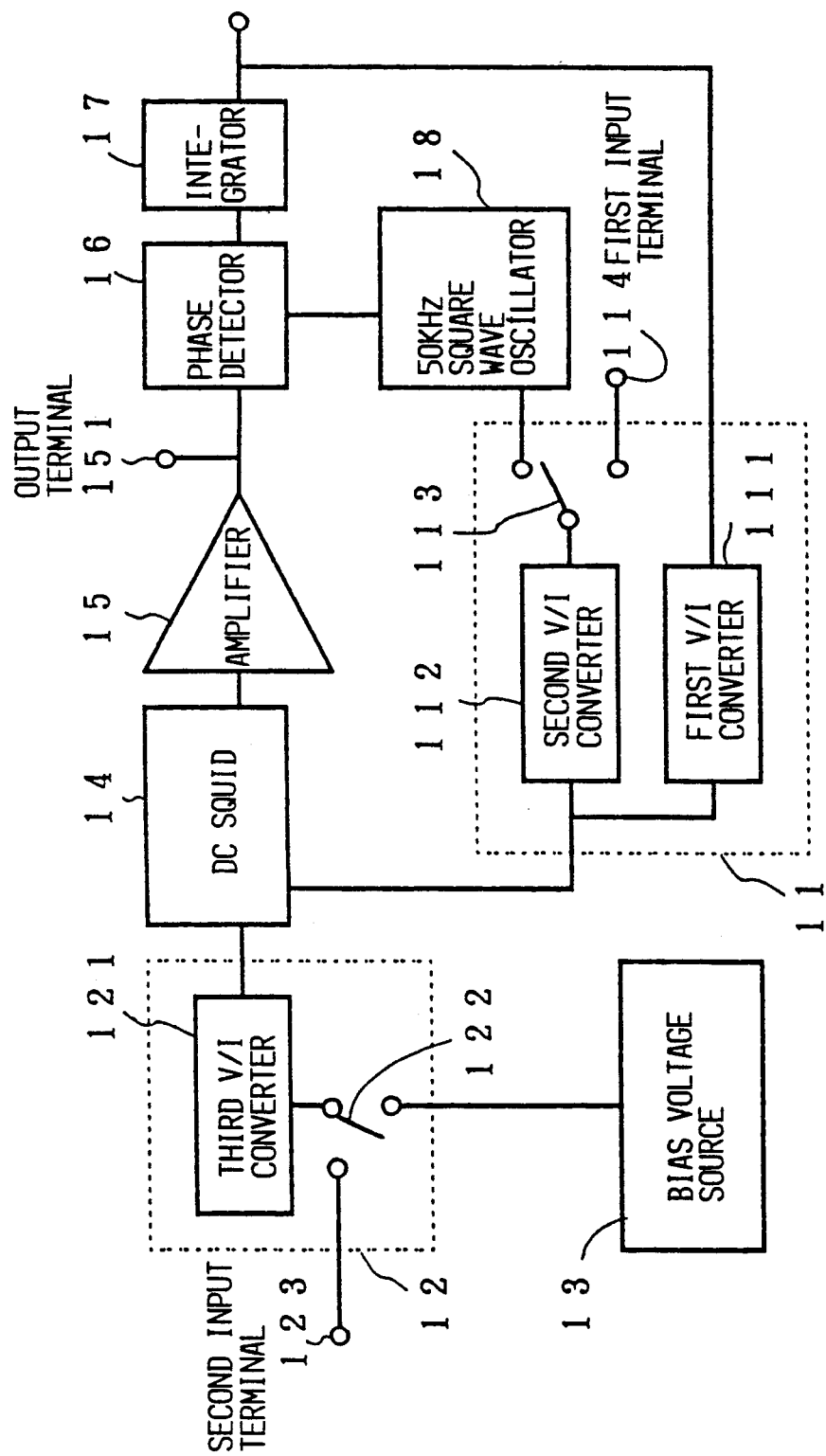
FIG. 1 is a block diagram showing the first embodiment of the highly sensitive magnetic field detecting according to the present invention.

The present invention will be described in detail in the following in connection with the embodiments thereof with reference to the accompanying drawings. FIG. 1 is a block diagram showing a structure of a highly sensitive magnetic field detecting device according to the first embodiment of the present invention. As shown in FIG. 1, a feedback modulation change-over circuit 11 is equipped with: three input terminals for a 50 KHz square wave oscillator 18, an integrator 17 and a first external input terminal 114; and one output terminal for a DC SQUID 14. The feedback modulation change-over circuit 11 is composed of: a first change-over switch 113 for selecting the inputs of a modulation signal coming from the 50 KHz square wave oscillator 18 and a signal coming from the first external input terminal 114; a second voltage-current converter 112 for converting a voltage signal of the first change-over switch 113 into a current signal; and a first voltage-current converter 111 for converting a feedback signal of the integrator 17 from a voltage signal into a current signal.

The current signals outputted from the first voltage-current converter 111 and the second voltage-current converter 112 are added to produce a feedback modulation current of the DC SQUID 14.

In FIG. 1, a bias change-over circuit 12 uses a bias voltage source 13 and a second external input terminal 123 as its inputs and is composed of a third voltage-current converter 121 and a second change-over switch 122 for selecting the input to the third voltage-current converter 121.

If the first embodiment is used as the highly sensitive magnetic field detecting device, the magnetic field is detected by setting the second change-over switch 122 of the bias change-over circuit 12 to the side of the bias voltage source 13 to feed the DC SQUID with the bias current and by setting the first change-over switch 113 of the feedback modulation change-over circuit 11 to the side of the 50 KHz square wave oscillator 18 to feed the DC SQUID 14 with the feedback modulation current.

If the element characteristics of the DC SQUID 14 are to be measured in the first embodiment, the current-to-voltage characteristics of the DC SQUID can be observed by setting both the outputs of the 50 KHz square wave oscillator 18 and the integrator 17 to 0 and the second change-over switch 122 of the bias change-over circuit 12 to the side of the second external input terminal 123 to input a variable voltage signal, as a measuring signal, from the second external input terminal 123 thereby to input a variable bias current to the DC SQUID 14 and by drawing a locus of the external input voltage, at the external input terminal 123, on a Y axis against the generated voltage, at the output terminal 151, on an X axis on an oscilloscope.

According to a method similar to that of the case in which the aforementioned first embodiment is used as the highly sensitive magnetic field detecting device, moreover, the flux-to-voltage characteristics of the DC SQUID 14 can be observed by feeding the DC SQUID with the bias current, by setting the first change-over switch 113 of the feedback modulation change-over circuit 11 to the side of the first external input terminal 114 to input a variable voltage signal, as a measuring signal, from the first external input terminal 114, by converting the inputted voltage signal into an electric signal by the second voltage-current converter 112 and inputting it to the DC SQUID 14 to generate a voltage corresponding to the current, by amplifying the generated current by an amplifier 15, and by drawing a locus of the external input voltage on a Y axis against the output of an output terminal 151 of the amplifier on an X axis on an oscilloscope.

Figure 2:
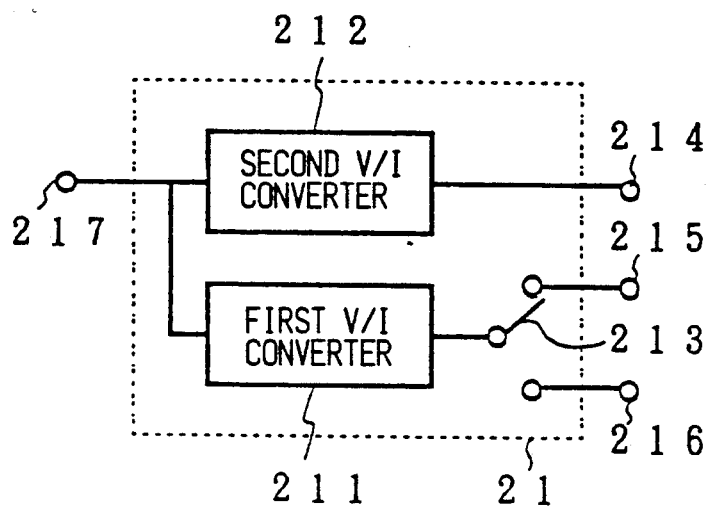
FIG. 2 is block diagram showing the second embodiment of the highly sensitive magnetic field detecting device according to the present intention.

FIG. 2 is a block diagram showing a feedback modulation change-over circuit of the highly sensitive magnetic field detecting device according to the second embodiment of the present invention. The portion other than the feedback modulation change-over circuit of the highly sensitive magnetic field detecting device is not different from that of FIG. 1. In FIG. 2, a feedback modulation change-over circuit 21 is equipped with three input terminals, i.e., a 50 KHz square wave oscillator connecting terminal 214, an integrator connecting terminal 215 and an external input terminal 216. A switch 213 is a change-over switch for selecting an input to a first voltage-current converter 211. The difference between the first embodiment and the second embodiment resides in that the first external input terminal is connected with the modulation signal line in the first embodiment but with the feedback signal line in the second embodiment.

If the second embodiment is to be used as the highly sensitive magnetic field detecting device, the bias current is fed by a method similar to the case in which the first embodiment is used as the highly sensitive magnetic field detecting device, to set the change-over switch 213 of FIG. 2 to the side of the input terminal 215 of the integrator by a method similar to that of the first embodiment.

If the element characteristics of the DC SQUID are to be measured in the second embodiment, the current-to-voltage characteristics are measured by a method similar to that of the current-voltage characteristics of the first embodiment. The method of measuring the flux-to-voltage characteristics is made similar to that for the flux-to-voltage characteristics of the first embodiment, by feeding the DC SQUID with the bias current and by setting the change-over switch 213 of FIG. 2 to the side of the external input terminal 216.

Figure 3:
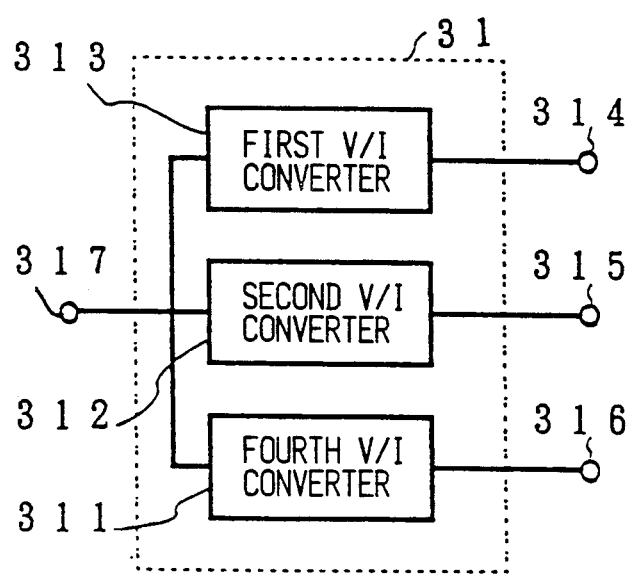
FIG. 3 is a block diagram showing the third embodiment of the highly sensitive magnetic field detecting according to the present invention.

FIG. 3 is a block diagram showing a feedback modulation change-over circuit of a highly sensitive magnetic field detecting device according to the third embodiment of the present invention. The portion other than the feedback modulation change-over circuit of the highly sensitive magnetic field detecting device is not different from that of FIG. 1. In FIG. 3, a feedback modulation change-over circuit 31 is equipped with: three input terminals, i.e., a 50 KHz square wave oscillator connecting terminal 315, an integrator connecting terminal 314 and an external input terminal 316; and one output terminal 317 for outputting to the DC SQUID. The difference from the first embodiment and the second embodiment resides in the provision of a fourth voltage-current converter for the external input signal.

If the third embodiment is used as the highly sensitive magnetic field detecting device, the magnetic field is detected by feeing the DC SQUID with the bias current and the feedback modulation current by a method similar to that in which the highly sensitive magnetic field detecting device of the first embodiment is used. The element characteristics of the DC SQUID are measured in the third embodiment by a method similar to the method of the first embodiment for measuring the current-to-voltage characteristics and the flux-to-voltage characteristics.

Figure 4:
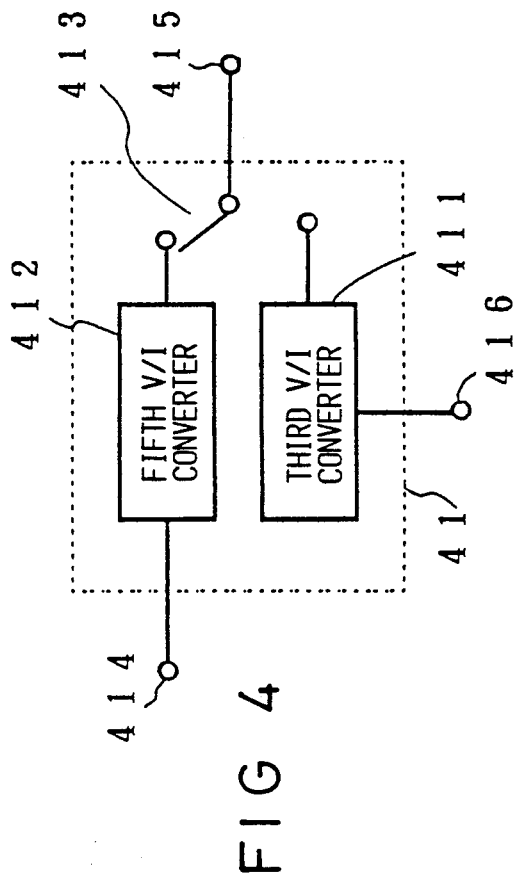
FIG. 4 is a block diagram showing the fourth embodiment of the highly sensitive magnetic field detecting according to the present invention.
Figure 5:
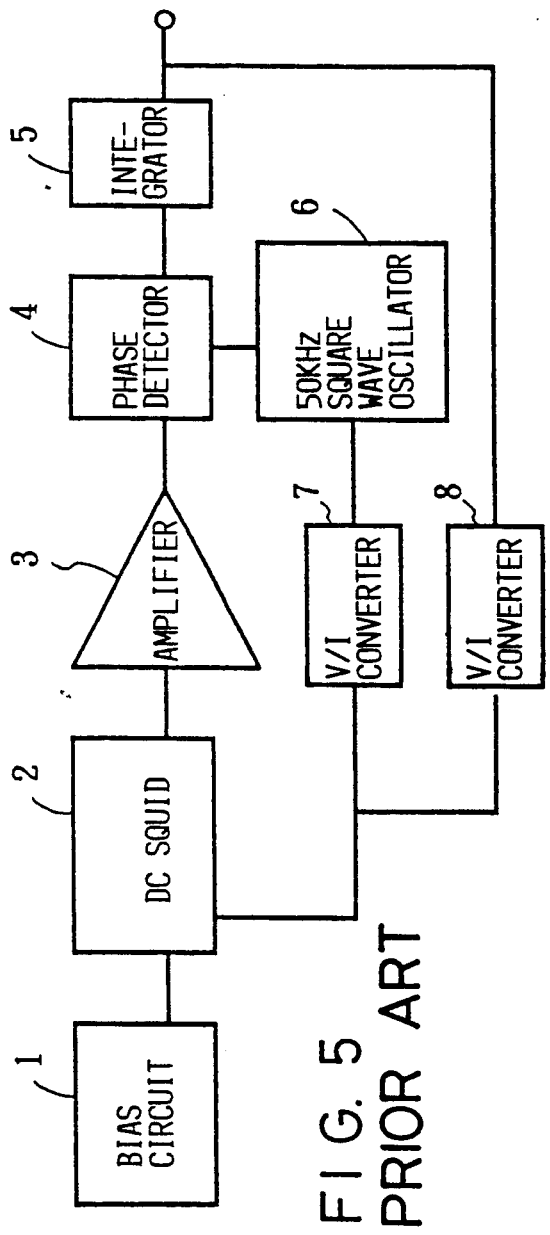
FIG. 5 is a block diagram showing a highly sensitive magnetic field detecting device of the prior art.
Figure 6:
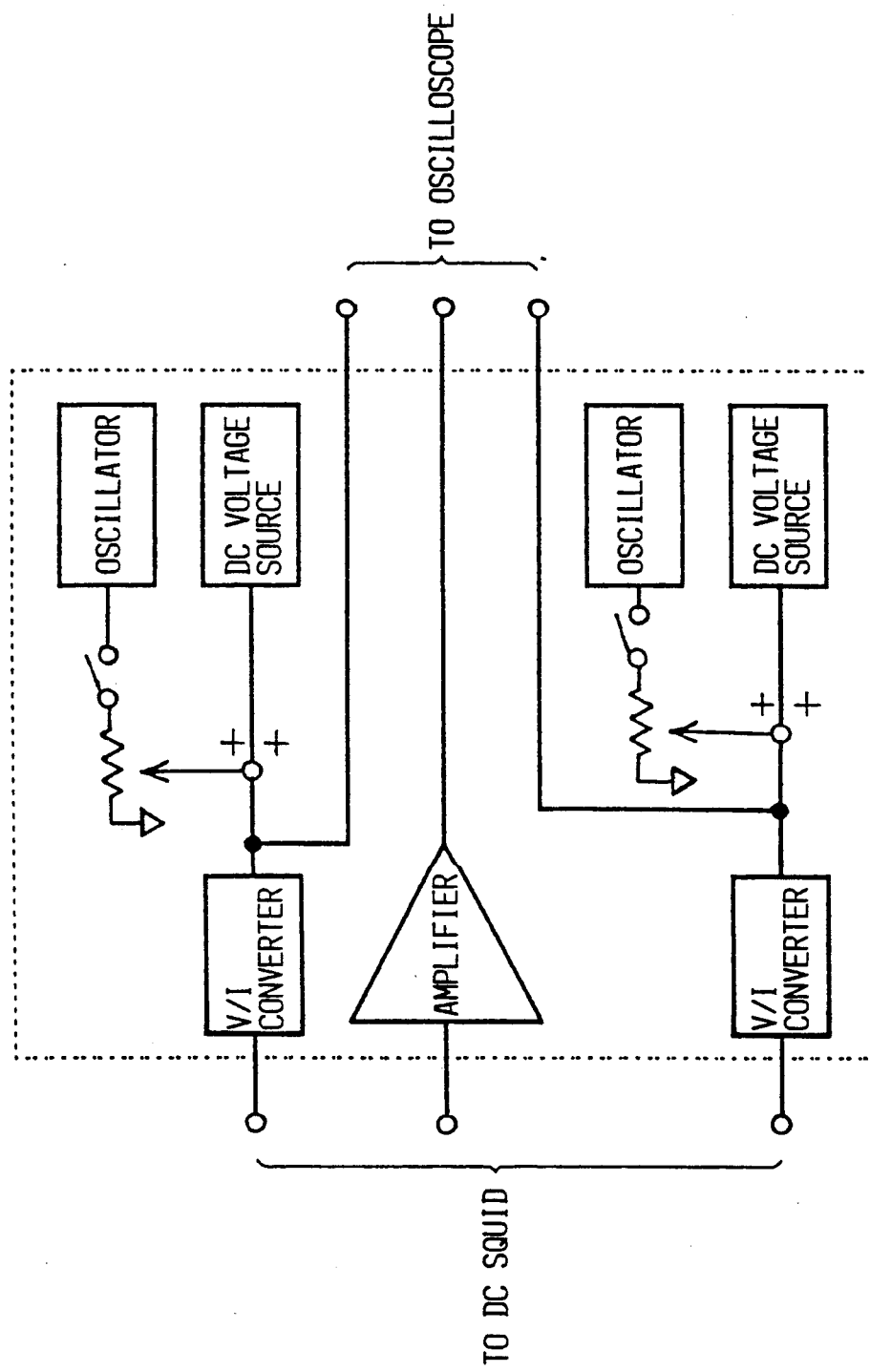
FIG. 6 is a block diagram showing a SQUID element measurement device of the prior art.

FIG. 4 is a block diagram showing a bias change-over circuit of a highly sensitive magnetic field detecting device according to the fourth embodiment of the present invention. The portion other than the bias change-over circuit of the highly sensitive magnetic field detecting device is not different from that of FIG. 1. In FIG. 4, a bias change-over circuit 41 is constructed to comprise a third voltage-current converter 411 for a bias voltage source terminal 416, a fifth voltage-current converter 412 for a second external input terminal, and a change-over switch 413 for selecting an output signal. The difference from the first embodiment resides in that the voltage-current converters for the bias voltage source and the external input are separately provided. Thus, the fourth embodiment is superior to the first embodiment in that it can set the current conversion gains of the bias power source and the second external input terminal can be separately set.

If the fourth embodiment is used as the highly sensitive magnetic field detecting device, the current-to-voltage characteristics are measured by a method similar to that of the first embodiment, in which the change-over switch 413 is set to the side of the bias voltage source terminal 416.

If the element characteristics of the DC SQUID 14 are to be measured in the fourth embodiment, the current-to-voltage characteristics are measured by a method similar to that of the first embodiment, in which the change-over switch 413 is set to the side of the second external input terminal 414. The flux-to-voltage characteristics are measured by a method similar to that of the first embodiment, in which the DC SQUID is fed with the bias current by a method similar to that of the case using the fourth embodiment as the highly sensitive magnetic field detecting device.

As has been described hereinbefore, the highly sensitive magnetic field detecting device of the prior art is additionally equipped with an integrator, an oscillator, a feedback modulation change-over circuit for receiving input from a first external input terminal and outputting it to a DC Squid, and a bias change-over circuit for receiving inputs from a bias voltage source and a second external input terminal and outputting them to the DC SQUID. Thus, the DC SQUID can have its characteristics measured, even when it is driven as the highly sensitive magnetic field detecting device, so that a breakage can be easily discovered.

What is claimed is:

1. An apparatus for detecting a fine magnetic field, comprising: a DC SQUID for detecting and converting a magnetic field to an electrical signal; a flux locked loop circuit for driving said DC SQUID, wherein said flus locked loop circuit includes an amplifier coupled to said DC SQUID for amplifying the electrical signal, a phase detector coupled to said amplifier for demodulating the electrical signal, an integration circuit coupled to the phase detector for outputting a voltage signal corresponding to the detected magnetic field, an oscillator coupled to the phase detector for supplying a demodulation frequency signal to the phase detector, a modulator having a first voltage-to-current converter coupled to said integrator circuit and a second voltage-to-current converter coupleable to said oscillator for supplying from such modulator a feedback modulation signal to said DC SQUID; and a bias source having a third voltage-to-current converter coupled to said DC SQUID for supplying a bias signal to said DC SQUID; wherein said modulator includes a first external input terminal and a feedback modulation change-over circuit coupled to the second voltage-to-current converter and coupled to either said first external input terminal or said oscillator for changing an internal feedback signal in said modulator to an external test signal inputted from said first external input terminal so that the external test signal can be used to observe the flux-to-voltage characteristics of the DC SQUID; and said bias source includes a second external input terminal and a bias change-over circuit coupled to the third voltage-to-current converter and coupleable to either said second external input terminal or a bias voltage source for changing an internal bias signal from the bias voltage source to an external test signal inputted from said second external input terminal so that the external test signal can be used to observe the current-to-voltage characteristics of the DC SQUID.

2. An apparatus according to claim 1; wherein said amplifier includes an external output terminal for a monitoring test output signal from said DC SQUID.

3. An apparatus for detecting a fine magnetic field, comprising: a DC SQUID for detecting and converting a magnetic field to an electrical signal; and a flux locked loop circuit for driving the DC SQUID comprising an amplifier coupled to the DC SQUID for amplifying the electrical signal, a phase detector coupled with the amplifier for modulating the amplified electrical signal, an integration circuit coupled to the phase detector for outputting a voltage signal corresponding to the detected magnetic field, an oscillator coupled to the phase detector for supplying a demodulating frequency signal to the phase detector, and a modulator comprising a first voltage-to-current converter and a second voltage-to-current having a common output for supplying a modulation signal to the DC SQUID, a first external input terminal, and a first change-over circuit coupled with either the first or second voltage-to-current converter and coupleable to either the first external input terminal or one of the integration circuit and the oscillator for changing an internal feedback signal to an external test signal inputted to the first external input terminal so that the external test signal can be used to observe the flux-to-voltage characteristics of the DC SQUID.

4. An apparatus for detecting a fine magnetic field according to claim 3; further comprising a bias source having a third voltage-to-current converter coupled to the DC SQUID for supplying a bias signal to the DC SQUID, the bias source including a second external input terminal and a second change-over circuit coupled to the third voltage-to-current converter and coupleable to either the second input terminal and a bias voltage source for changing an internal bias signal from the bias voltage source to an external test signal inputted to the second external input terminal so that the external test signal can be sued to observe the current-to-voltage characteristics of the DC SQUID.

5. An apparatus for detecting a fine magnetic field according to claim 4, wherein the first voltage-to-current converter is coupled with the integration circuit, the second voltage-to-current with either the oscillator or the first external input terminal, and the first change-over circuit includes means for changing an input to the second voltage-to-current converter between a feedback signal from the oscillator and the external test signal from the first external input terminal.

6. An apparatus for detecting a fine magnetic field according to claim 4; wherein the first voltage-to-current converter is coupleable through the first change-over circuit with either the integration circuit or the first external input terminal, the second voltage-to-current converter is coupled with the oscillator, and the first change-over circuit includes means for changing an input to the first voltage-to-current converter between a feedback signal from the integration circuit and the external test signal from the first external input terminal.

7. An apparatus for detecting a fine magnetic field according to claim 3; further comprising a bias source having a third voltage-to-current converter coupled between the DC SQUID and a bias voltage source through a second change-over circuit for supplying an internal bias signal to the DC SQUID, and another voltage-to-current converter coupled between the DC SQUID and a second external input terminal through the second change-over circuit for supplying an external through the second change-over circuit for supplying an external test signal to the DC SQUID, the second change-over circuit including means for changing between an internal bias signal supplied to the DC SQUID from the third voltage-to-current converter and the external test signal supplied to the DC SQUID from the other voltage-to-current converter so that the external test signal can be sued to observe the current-to-voltage characteristics of the DC SQUID.

8. An apparatus for detecting a fine magnetic field according to claim 4; wherein the amplifier includes an external output terminal for supplying a monitoring test output signal from the DC SQUID.

9. An apparatus for detecting a fine magnetic field according to claim 3; wherein the amplifier includes an external output terminal for supplying a monitoring test output signal from the DC SQUID.

10. An apparatus for detecting a fine magnetic field, comprising: a DC SQUID for detecting and converting a magnetic field to an electrical signal; and a flux locked loop circuit for driving the DC SQUID comprising an amplifier coupled to the DC SQUID for amplifying the electrical signal, a phase detector coupled with the amplifier for modulating the amplified electrical signal, an integration circuit coupled to the phase detector for outputting a voltage signal corresponding to the detected magnetic field, an oscillator coupled to the phase detector for supplying a demodulating frequency signal to the phase detector, and a modulator comprising a first voltage-to-current converter and a second voltage-to-current converter coupled respectively with the integration circuit and the oscillator for supplying from said modulator a modulation signal to the DC SQUID, a first external input terminal and another voltage-to-current converter coupled with the first external input terminal for supplying an external test signal to the DC SQUID so that the external test signal can be used to observe the flux-to-voltage characteristics of the DC SQUID.

* * * * *